United States Patent
Tang et al.

[11] Patent Number: 5,939,242
[45] Date of Patent: Aug. 17, 1999

[54] POSITIVE PHOTORESIST WITH AN ALKOXYALKYL ESTER GROUP-CONTAINING (CO)POLYMER AND CARBOXYL-GROUP CONTAINING (CO) POLYMER

[75] Inventors: Qian Tang, Oberwil; Martin Roth, Hölstein, both of Switzerland

[73] Assignee: Ciba Specialty Chemicals Corporation, Tarrytown, N.Y.

[21] Appl. No.: 08/757,391

[22] Filed: Nov. 27, 1996

Related U.S. Application Data

[63] Continuation-in-part of application No. 08/476,915, Jun. 7, 1995, abandoned.

[51] Int. Cl.$^6$ .............................. G03C 5/16; G03C 1/73
[52] U.S. Cl. .................. 430/329; 430/323; 430/270.1; 430/326; 430/910
[58] Field of Search .................... 430/270.1, 326, 430/910, 323, 329

[56] References Cited

U.S. PATENT DOCUMENTS

| | | | |
|---|---|---|---|
| 5,120,633 | 6/1992 | Bauer et al. | 430/270 |
| 5,252,427 | 10/1993 | Bauer et al. | 430/270 |
| 5,262,281 | 11/1993 | Bauer et al. | 430/323 |
| 5,369,200 | 11/1994 | Schadeli et al. | 526/262 |
| 5,397,680 | 3/1995 | Schadeli et al. | 430/270 |
| 5,482,816 | 1/1996 | Murata et al. | 430/910 |

FOREIGN PATENT DOCUMENTS

| | | | |
|---|---|---|---|
| 0451741 | 10/1991 | European Pat. Off. | G03F 7/039 |
| 0454334 | 10/1991 | European Pat. Off. | G03F 7/039 |
| 0488525 | 6/1992 | European Pat. Off. | G03F 7/004 |
| 0558280 | 9/1993 | European Pat. Off. | G03F 7/004 |
| 0568827 | 11/1993 | European Pat. Off. | G03F 7/16 |
| 0601974 | 6/1994 | European Pat. Off. | C08F 222/40 |
| 2248952 | 10/1990 | Japan | G03F 7/022 |
| 4-26850 | 1/1992 | Japan | G03F 7/039 |
| 517711 | 7/1993 | Japan | C09D 7/039 |

OTHER PUBLICATIONS

English Translation of JP 4–26850 Mayashi et al, Jan. 30, 1992.
Patent Abstracts of Japan, vol. 17, No. 291 JP 5017711, Jan. 1993.

*Primary Examiner*—Bernard Codd
*Attorney, Agent, or Firm*—David R. Crichton; Jacob M. Levine

[57] ABSTRACT

Positive photoresist compositions which can be developed in aqueous-alkaline media, comprising
(a) at least one homopolymer or copolymer containing acid-labile α-alkoxyalkyl ester groups,
(b) at least one carboxyl-containing copolymer in which the content of carboxyl groups is from 0.40 to 5.50 mol/kg,
(c) at least one compound which forms an acid on exposure to actinic radiation, and
(d) an organic solvent,
have high photosensitivity, a long shelf life of the components and of coatings produced therefrom and are particularly suitable as etch resists for the production of printed circuits.

14 Claims, No Drawings

POSITIVE PHOTORESIST WITH AN ALKOXYALKYL ESTER GROUP-CONTAINING (CO)POLYMER AND CARBOXYL-GROUP CONTAINING (CO)POLYMER

This application is a continuation-in-part of Ser. No. 08/476,915, filed Jun. 7, 1995, now abandoned.

The present invention relates to a positive photoresist composition which can be developed in aqueous-alkaline media, and to a process for the production of relief structures using this photoresist composition.

The lithographic production of relief structures on diverse substrates is frequently carried out using etch resists which contain a binder containing acid-sensitive groups and an acid photogenerator.

JP Kokai Hei 02-248952 describes photoresist compositions based on phenolic resins all or some of whose hydroxyl groups are substituted by tetrahydropyranyl ether groups. These compositions are distinguished by a high resolution capacity. However, they have the disadvantage of requiring heat treatment after exposure.

JP Kokai Hei 05-17711 discloses an etch resist composition comprising a copolymer of (meth)acrylic acid, tetrahydropyranyl (meth)acrylate and an alkyl acrylate and an acid photogenerator. This composition is deposited on the substrate by electrodeposition coating, giving a film of high homogeneity. However, the photosensitivity of this resist is relatively low. In addition, this process also requires heat treatment after exposure.

U.S. Pat. No. 5,252,427 describes copolymers which contain both acid-sensitive groups and free acid groups and which can be used in combination with conventional acid photogenerators as etch resists. However, the thermal stability of both the copolymers and the coatings produced therefrom is inadequate for certain applications.

The mixtures of copolymers containing acid-sensitive groups and copolymers containing free acid groups which are described in EP-A 568 827 can also be employed in combination with conventional acid photogenerators as base resins for positive photoresists. These photoresists again have the disadvantage of relatively low photosensitivity and of requiring heat treatment after irradiation.

It has now been found that the use of mixtures of specific organic homopolymers or copolymers gives photoresist materials of high photosensitivity which do not require thermal aftertreatment, have a long shelf life and give relief structures of good resolution.

The present invention relates to a positive photoresist composition which can be developed in aqueous-alkaline media, comprising (a) at least one homopolymer or copolymer containing acid-labile α-alkoxyalkyl ester groups, (b) at least one carboxyl-containing copolymer in which the content of carboxyl groups is from 0.40 to 5.50 mol/kg, (c) at least one compound which forms an acid on exposure to actinic radiation, and (d) an organic solvent.

Component (a) is preferably a homopolymer or copolymer comprising 8–100% by weight of recurring structural units of the formula Ia and 92–0% by weight of recurring structural units of the formula Ib

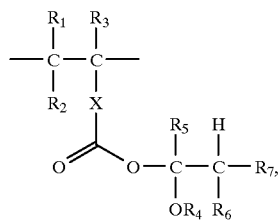

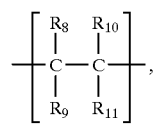

in which

X is a direct bond or a divalent organic group having 1–18 carbon atoms, in which one or more carbon atoms may be replaced by oxygen, sulfur or non-basic nitrogen atoms, $R_1$, $R_2$ and $R_3$, independently of one another are hydrogen, $C_1$–$C_6$alkyl, $C_5$–$C_{14}$aryl, $C_6$–$C_{20}$aralkyl, halogen, —COOH, —COOR$_{12}$ or —CONR$_{13}$R$_{14}$, where $R_{12}$ is an unsubstituted or $C_1$–$C_6$alkoxy-, hydroxcyl- or halogen-substituted $C_1$–$C_{18}$alkyl group or the radical of a hydroxyl-terminated polyether or polyester, and $R_{13}$ and $R_{14}$, independently of one another, are hydrogen, $C_1$–$C_{18}$alkyl, $C_5$–$C_{14}$aryl or $C_6$–$C_{20}$aralkyl, $R_4$ is $C_1$–$C_6$alkyl or phenyl, $R_5$ is hydrogen or $C_1$–$C_6$alkyl, and $R_6$ and $R_7$, independently of one another, are hydrogen, $C_1$–$C_6$alkyl or $C_1$–$C_6$alkoxy, or two of the radicals $R_4$, $R_5$, $R_6$ or $R_7$, together with the carbon or oxygen atoms to which they are bonded, form a 5- to 8-membered ring, $R_8$, $R_9$, $R_{10}$ and $R_{11}$, independently of one another, are hydrogen, $C_1$–$C_{18}$alkyl, unsubstituted or $C_1$–$C_6$-alkyl-, $C_1$–$C_6$alkoxy- or halogen-substituted phenyl, halogen, $C_1$–$C_{18}$alkoxy, —COOR$_{12}$, —OCOR$_{12}$ or —COOH, in which $R_{12}$ is as defined above, or $R_9$ and $R_{11}$ together with the carbon atoms to which they are bonded, form a five-membered ring having the structure

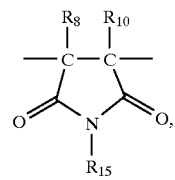

in which $R_{15}$ is hydrogen, $C_1$–$C_{18}$alkyl, $C_5$–$C_{14}$aryl, $C_6$–$C_{20}$aralkyl or hydroxyl-, alkoxy- or halogen-substituted phenyl, with the proviso that the mean molecular weight (weight average) of the homopolymer or copolymer is 1000–500,000 and the amount of COOH groups is at most 0.4 mol/kg.

The divalent radical X can be any divalent aliphatic, cycloaliphatic, aromatic, araliphatic or heterocyclic radical having 1–18 carbon atoms and may, if desired, contain hetero atoms, such as O, N or S, or functional groups, such as carbonyl groups or ester groups.

The term non-basic nitrogen atoms is taken to mean quaternized nitrogen atoms or nitrogen atoms containing electronegative substituents, for example carbonyl groups.

Alkyl or alkoxy groups $R_1$ to $R_{12}$ or alkyl or alkoxy groups as substituents of phenyl groups may be straight-chain or branched. Examples which may be mentioned are: methyl, ethyl, n-propyl, i-propyl, n-butyl, sec-butyl, tert-butyl, n-pentyl, neopentyl, n-hexyl, 2-ethylhexyl, methoxy, ethoxy, n-propoxy, i-propoxy, n-butoxy, sec-butoxy, tert-butoxy, n-pentoxy, neopentoxy and n-hexoxy.

Halogen atoms as substituents are preferably bromine or chlorine atoms.

In the formula Ia, $R_1$ and $R_2$ are preferably hydrogen, and $R_3$ is hydrogen or methyl.

Component (a) is particularly preferably a homopolymer or copolymer comprising recurring structural units of the formula III

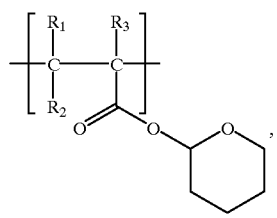
(III)

in which $R_1$, $R_2$ and $R_3$, independently of one another, are hydrogen, $C_1$–$C_6$alkyl, phenyl or halogen.

Component (a) is especially preferably a homopolymer or copolymer comprising recurring structural units of the formula III in which $R_1$ and $R_2$ are hydrogen and $R_3$ is hydrogen or methyl.

Component (b) is preferably a homopolymer or copolymer comprising 5–40% by weight of recurring structural units of the formula IIa and 95–60% by weight of recurring structural units of the formula IIb

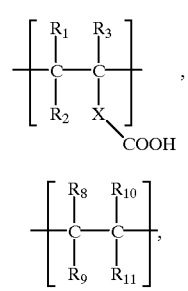

(IIa)

(IIb)

in which

X is a direct bond or a divalent organic group having 1–18 carbon atoms, in which one or more carbon atoms may be replaced by oxygen, sulfur or non-basic nitrogen atoms, $R_1$, $R_2$ and $R_3$, independently of one another are hydrogen, $C_1$–$C_6$alkyl, $C_5$–$C_{14}$aryl, $C_6$–$C_{20}$aralkyl, halogen, —COOH, —COOR$_{12}$ or —CONR$_{13}$R$_{14}$, where $R_{12}$ is an unsubstituted or $C_1$–$C_6$alkoxy-, hydroxyl- or halogen-substituted $C_1$–$C_{18}$alkyl group or the radical of a hydroxyl-terminated polyether or polyester, and $R_{13}$ and $R_{14}$, independently of one another, are hydrogen, $C_1$–$C_{18}$alkyl, $C_5$–$C_{14}$aryl or $C_6$–$C_{20}$aralkyl, $R_4$ is $C_1$–$C_6$alkyl or phenyl, $R_5$ is hydrogen or $C_1$–$C_6$alkyl, and $R_6$ and $R_7$, independently of one another, are hydrogen, $C_1$–$C_6$alkyl or $C_1$–$C_6$alkoxy, or two of the radicals $R_4$, $R_5$, $R_6$ or $R_7$, together with the carbon or oxygen atoms to which they are bonded, form a 5- to 8-membered ring, $R_8$, $R_9$, $R_{10}$ and $R_{11}$, independently of one another, are hydrogen, $C_1$–$C_{18}$alkyl, unsubstituted or $C_1$–$C_6$-alkyl-, $C_1$–$C_6$alkoxy- or halogen-substituted phenyl, halogen, $C_1$–$C_{18}$alkoxy, —COOR$_{12}$, —OCOR$_{12}$ or —COOH, in which $R_{12}$ is as defined above, or $R_9$ and $R_{11}$ together with the carbon atoms to which they are bonded, form a five-membered ring having the structure

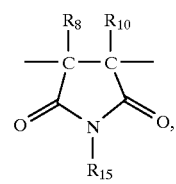

in which $R_{15}$ is hydrogen, $C_1$–$C_{18}$alkyl, $C_5$–$C_{14}$aryl, $C_6$–$C_{20}$aralkyl or hydroxyl-, alkoxy- or halogen-substituted phenyl, with the proviso that the mean molecular weight (weight average) of the copolymer is 1000–500,000 daltons and the content of carboxyl groups is from 0.40 to 5.50 mol/kg, preferably from 0.45 to 4.00 mol/kg and in particular from 0.50 to 3.00 mol/kg.

Component (b) is preferably a homopolymer or copolymer comprising recurring structural units of the formula IIa in which $R_1$ and $R_2$ are hydrogen, $R_3$ is hydrogen or methyl, and X is a direct bond.

In the structural units of the formula IIb, $R_8$ and $R_9$ are preferably hydrogen, $R_{10}$ is hydrogen or methyl, and $R_{11}$ is preferably phenyl or —COOR$_{12}$, in which $R_{12}$ is $C_1$–$C_{18}$alkyl. Preference is furthermore given to copolymers comprising recurring structural units of the formula

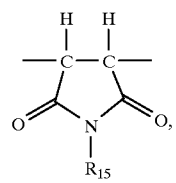

in which $R_{15}$ is phenyl.

Especially preferred components (b) contain 7–35% by weight, in particular 10–30% by weight, of recurring structural units of the formula IIa and 93–65% by weight, in particular 90–70% by weight, of recurring structural units of the formula IIb.

The homopolymers and copolymers of components (a) and (b) can be prepared in a known manner by anionic, cationic or group-transfer polymerization or in particular by free-radical polymerization on the corresponding unsaturated monomers.

The free-radical polymerization or copolymerization can be carried out using various methods. These have been described, for example, by S. Sandler and W. Karo in "Polymer Synthesis", Vol. 1, pp. 3–17, 1968, Academic Press, New York. Examples of conventional polymerization processes are bulk and solution polymerization, and furthermore emulsion, suspension and precipitation polymerization.

If desired, the molecular weight can be adjusted by adding small amounts of a regulator.

The polymerization is generally initiated by a conventional free-radical initiator. These include thermal initiators, such as azo compounds, for example α,α'-azoisobutyronitrile (AIBN), or peroxides, for example benzoyl peroxide, or redox initiator systems, such as the mixture of iron(III) acetylacetonate, benzoin and benzoyl peroxide, or photochemical free-radical formers, such as benzoin or benzil dimethyl ketal.

The polymerization is preferably carried out in solution. The reaction temperature is generally in the range from 10 to 200° C., preferably from 40 to 150° C., particularly preferably from 40 to 100° C.

Any solvent present must be inert under the reaction conditions. Examples of suitable solvents are aromatic hydrocarbons, chlorinated hydrocarbons, alcohols, ketones and ethers. Examples thereof are: benzene, toluene, xylenes, ethylbenzene, isopropylbenzene, ethylene chloride, propylene chloride, methylene chloride, chloroform, methyl ethyl ketone, acetone, methoxypropyl acetate, isopropanol, cyclohexanone, diethyl ether and tetrahydrofuran.

Examples of suitable monomers for the preparation of homopolymers or copolymers containing acid-labile α-alkoxyalkyl ester groups are 1-ethoxyethyl acrylate, methacrylate and p-vinylbenzoate, 1-butoxyethyl acrylate, methacrylate and p-vinylbenzoate, 1-ethoxy-1-propyl acrylate, methacrylate and p-vinylbenzoate, and tetrahydropyranyloxy acrylate, methacrylate and p-vinylbenzoate.

Particular preference is given to tetrahydropyranyl acrylate and methacrylate.

The monomers containing acid-labile α-alkoxyalkyl ester groups can be homopolymerized or alternatively copolymerized with one or more further monomers.

Examples of suitable monomers for the preparation of copolymers are ethylene, propylene, styrene, vinyl chloride, vinyl acetate, acrylic and methacrylic acid, methyl acrylate and methacrylate, ethyl acrylate and methacrylate, butyl acrylate and methacrylate, benzyl acrylate and methacrylate, 2-ethylhexyl acrylate and methacrylate and 2-hydroxyethyl acrylate and methacrylate.

Preference is given to methyl acrylate, methyl methacrylate, ethyl acrylate, butyl acrylate, benzyl methacrylate, 2-ethylhexyl methacrylate and 2-hydroxyethyl methacrylate.

The carboxyl-containing homopolymers and copolymers of component (b) can be prepared analogously by free-radical polymerization of the corresponding unsaturated carboxylic acids.

Examples of suitable carboxylic acids are maleic acid, itaconic acid, cinnamic acid, crotonic acid, p-vinylbenzoic acid and in particular acrylic acid and methacrylic acid.

The unsaturated carboxylic acids can be copolymerized with one or more further monomers, for example ethylene, propylene, styrene, vinyl chloride, vinyl acetate, methyl acrylate and methacrylate, ethyl acrylate and methacrylate, butyl acrylate and methacrylate, benzyl acrylate and methacrylate, 2-ethylhexyl acrylate and methacrylate, 2-hydroxyethyl acrylate and methacrylate and N-phenylmaleimide.

Preferred comonomers are methyl acrylate, methyl methacrylate, ethyl acrylate, butyl acrylate, benzyl methacrylate, tert-butyl acrylate, tert-butyl methacrylate, 2-ethylhexyl methacrylate and N-phenylmaleimide.

Component (a) in preferred compositions according to the invention comprises at least one homopolymer or copolymer comprising 20–100% by weight, in particular 30–100% by weight, of recurring structural units of the formula Ia and 80–0% by weight, in particular 70–0% by weight, of recurring structural units of the formula Ib.

Component (b) in the compositions according to the invention preferably comprises at least one copolymer comprising 5–35% by weight, in particular 10–30% by weight of recurring structural units of the formula IIa and 95–65% by weight, in particular 90–70% by weight, of recurring structural units of the formula IIb.

The mixing radio between components (a) and (b) can vary within a broad range. The compositions according to the invention preferably comprise 10–95% by weight, in particular 20–80% by weight, of component (a) and 90–5% by weight, in particular 80–20% by weight, of component (b), based on the sum of components (a)+(b).

Component (c) can in principle be any compound which forms an acid on exposure to actinic radiation which is known to the skilled worker in resist technology, for example onium salts, disulfones, iron/arene complexes, compounds containing photolabile halogen atoms (for example halomethyltriazines, tetrabromomethane, etc), sulfonic acid esters, for example nitrobenzyl sulfonate, oxime sulfonates, α-sulfonyloxyketones, N-hydroxyimidosulfonates and N-hydroxyarnidosulfonates.

Examples of suitable photoinitiators are described in EP-A 451 741 and EP-A 568 827.

Component (c) is preferably a photosensitive diazonium, sulfonium, sulfoxonium or iodonium salt or a photosensitive sulfonic acid ester.

Component (c) is particularly preferably triphenylsulfonium trifluoromethanesulfonate, triphenylsulfonium hexafluoroantimonate, triphenylsulfonium hexafluorophosphate, triphenylsulfonium hexafluoroantimonate or a hexafluorophosphate or hexafluoroantimonate of the following sulfonium ions:

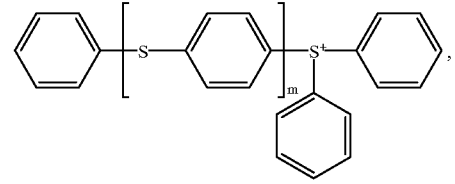

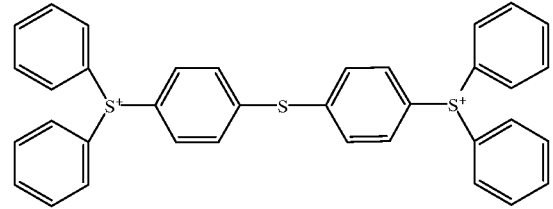

in which m is an integer from 1 to 10.

Component (c) is generally employed in an amount of from 1–20% by weight, preferably 2–10% by weight, based on the sum of components (a)+(b).

If expedient, sensitizers can be added to the compositions according to the invention. These sensitizers increase the spectral sensitivity of the photoinitiator system at the desired wavelength. The choice of suitable sensitizer depends essentially on the photoinitiator selected. For example, sulfonium and iodonium salts only have adequate photosensitivity at wavelengths of <350 nm. The sensitivity of such compounds at higher wavelengths can be significantly increased, for example, by adding aromatic hydrocarbons, such as perylene, pyrene, anthracene and derivatives thereof, phenothiazine or phenothiazine derivatives, or unsubstituted or substituted thioxanthone. The aminoaryl ketones disclosed, for example, in U.S. Pat. No. 4,755,450 are also suitable as sensitizers for sulfonium and iodonium salts. Other suitable sensitizers are the arylidene aryl ketones disclosed in U.S. Pat. No. 4,162,162.

The compositions according to the invention can include further conventional additives, for example stabilizers, pigments, dyes, fillers, adhesion promoters, flow-control agents, wetting agents and plasticizers.

In order to increase the shelf life, it may be expedient to add small amounts of weakly basic additives to the compositions according to the invention. Examples of suitable basic compounds are primary, secondary and tertiary aliphatic, cycloaliphatic and aromatic amines and N-heterocyclic compounds. Examples which may be mentioned are: triethylamine, tripropylamine, tributylamine, aniline, N-methylaniline, N,N-dimethylaniline, 1-naphthylamine, 2-naphthylamine, diphenylamine, ethylenediamine, hexamethylenediamine, 4,4'-diaminodiphenylmethane, 4,4'-diaminodiphenyl ether, 4,4'-diaminobenzophenone, 4,4'-diaminodiphenylamine, pyrrolidine and derivates thereof, piperidine and derivates thereof, imidazole and derivates thereof, for example 4-methylimidazole, 4-methyl-2-phenylimidazole, 4,5-diphenylimidazole and in particular 1-methylimidazole.

The amount in which the basic additives are expediently added depends essentially on the amount of acid photogenerator (c), and is preferably 0.01–5.0 mmol, in particular 0.02–2.0 mmol, of basic additive per gram of acid photogenerator.

A stabilizing action is also achieved if the polymers of components (a) and/or (b) contain small amounts of basic substituents, for example amino groups. In order to prepare such polymers, a small amount of unsaturated monomers containing basic substituents is added to the unsaturated starting monomers during the free-radical polymerization. Examples of suitable monomers containing basic substituents are amino-substituted acrylates, such as 2-dimethylaminoethyl acrylate, 2-dimethylaminoethyl methacrylate, 2-diethylaminoethylacrylate, 2-diethylaminoethyl methacrylate, dimethylaminopropylacrylamide, dimethylaminopropylmethacrylamide, 2-t-butylaminoethyl acrylate and 2-t-butylaminoethyl methacrylate, and vinylpyridines, such as 2-vinylpyridine or 4-vinylpyridine.

The amount in which such comonomers containing basic substituents are expediently employed depends essentially on the amount of acid photogenerator (c) and is preferably 0.01–5.0 mmol, in particular 0.02–2.0 mmol, of comonomer containing basic substituents per gram of acid photogenerator.

The choice of solvent and concentration depends principally on the composition type and on the coating method. The solvent must be inert, ie. it must not undergo any chemical reaction with the components and it must be removable again during drying after coating. Examples of suitable solvents are ketones, ethers and esters, such as methyl ethyl ketone, 2-heptanone, cyclopentanone, cyclohexanone, γ-butyrolactone, ethyl pyruvate, diethylene glycol dimethyl ether, 2-methoxyethanol, 2-ethoxyethanol, 2-ethoxyethyl acetate, 1-methoxy-2-propyl acetate, 1,2-dimethoxyethane, ethyl acetate and 3-methoxymethyl propionate.

The preferred solvent is methoxypropyl acetate.

The solids content of the compositions depends on the application method and on the desired coating thickness and is typically from 10 to 80% by weight.

The solution is applied uniformly to a substrate by known coating methods, for example by spincoating, dipping, knife coating, curtain coating, brushing, spraying and especially by electrostatic spraying and reverse-roll coating. It is also possible to apply the photosensitive coating to a temporary, flexible support and then to coat the final substrate, for example a copper-laminated circuitboard, by transferring the coating by lamination.

The application rate (coating thickness) and the substrate type (coating support) depend on the desired area of application. The coating thickness range generally covers values of about 1 μm to about 20 μm, preferably 3–15 μm.

After the coating, the solvent is generally removed by drying preferably at temperatures of from 20° C. to 100° C., giving a coating of the composition according to the invention on the substrate.

In order to produce relief structures, the substrate coated with the composition according to the invention is exposed imagewise to actinic radiation. The term "actinic radiation" is generally taken to mean UV or VIS radiation, preferably in the wavelength range of 220–550 nm. The term "imagewise" exposure covers both exposure through a photomask containing a predetermined pattern and exposure by a laser beam, which is moved, for example, under computer control, over the surface of the coated substrate.

Radiation sources which can be used are in principle all lamps which emit radiation in the UV and/or VIS region. Both point light sources and spread emitters (lamp carpets) are suitable. Examples are: carbon arc lamps, xenon arc lamps, mercury vapour lamps, if desired doped with metal halides (metal halide lamps), fluorescent lamps, argon incandescent lamps, electronic flash lamps, photographic flood lamps, electron beams and X-rays. The distance between the lamp and the novel image material can vary depending on the application and lamp type and strength, for example between 2 cm and 150 cm. Particularly suitable are laser light sources, for example argon ion lasers and krypton ion lasers. Laser light also allows the resist to be exposed without a mask by writing the controlled laser beam directly on the resist layer. The high sensitivity of the novel materials is very advantageous here, allowing high writing speeds at relatively low intensity. This method allows the production of printed circuits in the electronics industry, lithographic offset printing plates or relief printing plates and photographic image-recording materials.

In contrast to many known positive photoresist systems based on chemical amplification, there is surprisingly no need when using the compositions according to the invention to subject the resist to heat treatment after exposure, known as "post exposure bake", in order to ensure complete reaction of the acid-sensitive groups in the polymer structure with the acid generated by the exposure and to remove volatile reaction products.

If desired, however, such heat treatment can be carried out without adverse consequences for the exposed structures.

After the material has been exposed imagewise in the conventional manner, the exposed areas of the photoresist are removed by dissolution in a developer.

The choice of the particular developer depends on the type of photoresist, in particular on the nature of the binder used or the photolysis products formed. The developer can comprise aqueous solutions of bases to which organic solvents or mixtures thereof may have been added.

Particularly preferred developers are aqueous-alkaline solutions, as also employed for the development of naphthoquinone diazide coatings. These include, in particular, aqueous solutions of alkali metal silicates, phosphates, hydroxides and carbonates. If desired, relatively small amounts of wetting agents and/or organic solvents can also have been added to these solutions.

Examples of typical organic solvents which may be added to the developer fluids are cyclohexanone, 2-ethoxyethanol, acetone, isopropanol, ethanol and mixtures of two or more of these solvents.

The radiation-sensitive compositions according to the invention are suitable as photoresists for electronics, in particular as etch resists for the production of printed circuits or as microresists for the production of integrated circuits, and for the production of printing plates, for example offset printing plates.

In the preferred use of the composition according to the invention, as etch resists, the metal uncovered by the development, usually copper, can be removed using any known etchant, for example solutions of iron chloride, hydrogen peroxide/phosphoric acid, ammonium persulfate or copper chloride.

The photoresist coating which remains can subsequently be removed by stripping with strong aqueous bases, for example NaOH or KOH, and/or organic solvents.

The present invention thus furthermore relates a process for the production of relief structures on a circuit board, which comprises coating a substrate with a composition according to claim 1 and exposing the film obtained after removal of the solvent imagewise and subsequently developing the exposed film in an aqueous-alkaline medium.

A preferred embodiment of the invention is a process for the production of relief structures which comprises the following steps:
(A) coating a copper-laminated substrate with a composition according to claim 1 by application of liquid resists by known methods;
(B) removal of the solvent by drying at temperatures of from 30° C. to 130° C.;
(C) exposure to actinic radiation through a mask or by means of direct laser irradiation;
(D) development using aqueous-alkaline or semiaqueous-alkaline developer solutions;
(E) etching with acidic or weakly alkaline etchants;
(F) removal of the photoresist coating which remains by stripping with strong aqueous bases and/or organic solvents.

Particular mention should be made of the extremely good thermal stability of the individual components and the resultant coatings on storage.

A suitable choice of the polymers of components (a) and (b) also allows the mechanical properties of the resist composition to be varied within a broad range. For example, use of hard polymers allows very high mechanical strength to be achieved.

EXAMPLES

I. Preparation of the Polymers

I.1. Poly-2-tetrahydropyranyl methacrylate

A solution of 10 g (59 mmol) of 2-tetraliydropyranyl methacrylate and 0.25 g of azoisobutyronitrile (AIBN) in 15 g of methoxypropyl acetate is stirred for 8 hours at 80° C. under a nitrogen atmosphere. The resultant solution of poly-2-tetrahydropyranyl methacrylate ($M_n$=4435, $M_w$=91,593) can be further processed directly (without isolation of the polymer.

Acid content of the solution: 0.033 mol/kg; Acid content after 9 months at room temperature: 0.040 mol/kg.

I.2. Copolymer of 2-tetrahydropyranyl methacrylate, methyl methacrylate and 2-ethylhexyl methacrylate Analogously to Example I.1, a solution of 25.2 g (148 mmol) of 2-tetrahydropyranyl methacrylate, 10.4 g (104 mmol) of methyl methacrylate, 4.4 g (22 mmol) of 2-ethylhexyl methacrylate and 1 g of azoisobutyronitrile in 60 g of methoxypropyl acetate is stirred for 8 hours under nitrogen. The resultant solution of the copolymer ($M_n$=7237, $M_w$=48,154) can be further processed directly.

I.3. Copolymer of 2-tetrahydropyranyl methacrylate, methyl methacrylate and 2-hydroxyethyl methacrylate A solution of 56.7 g (333 mmol) of 2-tetrahydropyranyl methacrylate, 23.4 g (234 mmol) of methyl methacrylate, 9.9 g (76 mmol) of 2-hydroxyethyl methacrylate and 2 g of azoisobutyronitrile in 50 g of methoxypropyl acetate is added dropwise over the course of one hour with stirring at 80° C. under nitrogen to a mixture of 6.3 g (37 mmol) of 2-tetrahydropyranyl methacrylate, 2.6 g (26 mmol) of methyl methacrylate, 1.1 g (9 mmol) of 2-hydroxyethyl methacrylate and 100 g of methoxypropyl acetate. Stirring is continued at 80° C., and, one hour after the addition, a further 0.5 g of azoisobutyronitrile is added. The solution is subsequently stirred at 80° C. for 6 hours. The resultant solution of the copolymer ($M_n$=8103, $M_w$=47,096) can be further processed directly.

I.4. Copolymer of 2-tetrahydropyranyl acrylate and methyl methacrylate

A solution of 34.02 g (218 mmol) of 2-tetrahydropyranyl acrylate, 19.98 g (200 mmol) of methyl methacrylate and 1.2 g of azoisobutyronitrile in 30 g of methoxypropyl acetate is added dropwise over the course of 1.5 hours with stirring at 80° C. under nitrogen to a mixture of 3.78 g (24 mmol) of 2-tetrahydropyranyl acrylate, 2.22 g (22 mmol) of methyl methacrylate and 60 g of methoxypropyl acetate. Stirring is continued at 80° C., and, one hour after the addition, a further 0.3 g of azoisobutyronitrile is added. The solution is subsequently sirred at 80° C. for a further 5.5 hours. The resultant solution of the copolymer ($M_n$=8108, $M_w$=32,167) can be further processed directly.

I.5. Copolymer of methacrylic acid, methyl methacrylate and 2-ethylhexyl methacrylate Analogously to Example I.1., a solution of 4.0 g (47 mmol) of methacrylic acid, 12.0 g (120 mmol) of methyl methacrylate and 4.0 g (20 mmol) of 2-ethylhexyl methacrylate and 0.5 g of azoisobutyronitrile in 30 g of isopropanol is stirred for 8 hours under nitrogen. The resultant solution of the copolymer ($M_n$=8691, $M_w$=54,540, acid content=1.13 mol/kg) can be further processed directly.

I.6. Copolymer of methacrylic acid, methyl methacrylate and tert-butyl acrylate

A solution of 135 g (1.568 mol) of methacrylic acid, 630 g (6.30 mol) of methyl methacrylate, 135 g (1.05 mol) of tert-butyl acrylate and 12.5 g of azoisobutyronitrile in 500 g of isopropanol is added dropwise over the course of 2 hours with stirring at 80° C. under nitrogen to a mixture of 15.0 g (174 mmol) of methacrylic acid, 70 g (700 mmol) of methyl methacrylate, 15.0 g (117 mmol) of tert-butyl acrylate and 1000 g of isopropanol. Stirring is continued at 80° C., and, one hour after the addition, a further 2.5 g of azoisobutyronitrile are added.

The solution is subsequently stirred at 80° C. for a further 5 hours. The resultant solution of the copolymer ($M_n$=8880, $M_w$=27,422, acid content=0.75 mol/kg) can be further processed directly.

I.7. Copolymer of 2-tetrahydropyranyl methacrylate, methyl acrylate and 2-hydroxyethyl methacrylate A solution of 34.02 g (200 mmol) of 2-tetrahydropyranyl methacrylate, 14.04 g (163 mmol) of methyl acrylate, 5.94 g (46 mmol) of 2-hydroxyethyl methacrylate and 1.74 g of azoisobutyronitrile in 30 g of methoxypropyl acetate is added dropwise over the course of 6 hours with stirring at 70° C. under nitrogen to a mixture of 3.78 g (22 mmol) of 2-tetrahydropyranyl methacrylate, 1.56 g (18 mmol) of methyl acrylate, 0.66 g (5 mmol) of 2-hydroxyethyl methacrylate and 60 g of methoxypropyl acetate. Stirring is continued at 70° C., and, one hour after the addition, a further 0.18 g of azoisobutyronitrile is added. The solution is subsequently stirred at 70° C. for a further hour. The resultant solution of the copolymer ($M_n$=9074, $M_w$=44,877) can be further processed directly.

I.8. Copolymer of methacrylic acid, methyl methacrylate, ethyl acrylate and methacrylamide A solution of 27 g (314 mmol) of methacrylic acid, 99 g (990 mmol) of methyl methacrylate, 45 g (450 mmol) of ethyl acrylate, 9.0 g (80 mmol) of methacrylamide and 2.5 g of azoisobutyronitrile in 100 g of methoxypropyl acetate is added dropwise over the course of 2.25 hours with stirring at 80° C. under nitrogen to a mixture of 3.0 g (35 mmol) of methacrylic acid, 11 g (110 mmol) of methyl methacrylate, 5.0 g (50 mmol) of ethyl acrylate, 1.0 g (9 mmol) of methacrylamide and 200 g of methoxypropyl acetate. Stirring is continued at 80° C., and, one hour after the addition, a further 0.5 g of azoisobutyronitrile is added.

The solution is subsequently stirred at 80° C. for a further 4.75 hours. The resultant solution of the copolymer ($M_n$=8547, $M_w$=31,820, acid content=0.84 mol/kg) can be further processed directly.

I.9. Copolymer of methacrylic acid, methyl methacrylate and ethyl acrylate

A solution of 27 g (314 mmol) of methacrylic acid, 99 g (990 mmol) of methyl methacrylate, 54 g (540 mmol) of ethyl acrylate and 2.5 g of azoisobutyronitrile in 100 g of methoxypropyl acetate is added dropwise over the course of 2 hours with stirring at 80° C. under nitrogen to a mixture of 3.0 g (35 mmol) of methacrylic acid, 11 g (110 mmol) of methyl methacrylate, 6.0 g (60 mmol) of ethyl acrylate and 200 g of methoxypropyl acetate. Stirring is continued at 80° C., and, one hour after the addition, a further 0.5 g of azoisobutyronitrile is added.

The solution is subsequently stirred at 80° C. for a further 5 hours. The resultant solution of the copolymer ($M_n$=8993, $M_w$=43,314, acid content=0.7 mol/kg) can be further processed directly.

I.10 Copolymer of methacrylic acid, methyl methacrylate and ethyl acrylate

A solution of 21.6 g (251 mmol) of methacrylic acid, 104.4 g (1.04 mol) of methyl methacrylate, 54 g (540 mmol) of ethyl acrylate and 4.0 g of azoisobutyronitrile in 100 g of methoxypropyl acetate is added dropwise over the course of 2 hours with stirring at 80° C. under nitrogen to a mixture of 2.4 g (28 mmol) of methacrylic acid, 11.6 g (116 mmol) of methyl methacrylate, 6.0 g (60 mmol) of ethyl acrylate and 200 g of methoxypropyl acetate. Stirring is continued at 80° C., and, one hour after the addition, a further 1.0 g of azoisobutyronitrile is added.

The solution is subsequently stirred at 80° C. for a further 5 hours. The resultant solution of the copolymer ($M_n$=9275, $M_w$=30,304, acid content=0.61 mol/kg) can be further processed directly.

I.11. Copolymer of methacrylic acid, methyl methacrylate and N-phenylmaleimide

A solution of 36.0 g (419 mmol) of methacrylic acid, 126 g (1.26 mol) of methyl methacrylate, 18 g (104 mmol) of N-phenylmaleimide and 5.0 g of Trigonox C (Akzo product) in 100 g of methoxypropyl acetate is added dropwise over the course of 2 hours with stirring at 135° C. under nitrogen to a mixture of 4.0 g ((26.5 mmol) of methacrylic acid, 14.0 g (140 mmol) of methyl methacrylate, 2.0 g (11.6 mmol) of N-phenylmaleimide and 200 g of methoxypropyl acetate.

The solution is subsequently stirred at 135° C. for 6 hours. The resultant solution of the copolymer ($M_n$=3883, $M_w$=10,041, acid content=0.933 mol/kg) can be further processed direcdy.

I.12. Copolymer of 2-tetrahydropyranyl acrylate, methyl methacrylate and 2-dimethylaminoethyl methacrylate A solution of 56.7 g (333 mmol) of 2-tetrahydropyranyl methacrylate, 33.0 g (33 mmol) of methyl methacrylate, 0.27 g (1.72 mmol) of 2-dimethylaminoethyl methacrylate and 2.0 g of azoisobutyronitrile in 50 g of methoxypropyl acetate is added dropwise over the course of 2 hours with stiling at 70° C. under nitrogen to a mixture of 6.3 g (37 mmol) of 2-tetrahydropyranyl methacrylate, 3.67 g (36.7 mmol) of methyl methacrylate, 0.03 g (0.19 mmol) of 2-dimethylaminoethyl methacrylate and 100 g of methoxypropyl acetate. Stirring is continued at 70° C., and, one hour after the addition, a further 0.5 g of azoisobutyronitrile is added.

The solution is subsequently stirred at 70° C. for a further 5 hours. The resultant solution of the copolymer ($M_n$=9334, $M_w$=44,050) can be further processed directly.

II. Use examples

II.1. Positive Etch Resist

A solution of 0.23 g of the photoinitiator Degacure® KI 85 (Degussa) and 0.04 g of 9-methylanthracene in 3 g of methoxypropyl acetate is added to a mixture of 2 g of the solution from Example I.1. and 3 g of the solution firom Example I.6. The resultant resist solution is filtered and subsequently applied to a copper-laminated substrate (18 μm of copper) by means of a K-bar coater (36 μm). The coated substrate is dried for 10 minutes at room temperature and subsequently for 15 minutes at 80° C., giving a resist film with a thickness of 9 μm. Exposure is carried by means of a PR 340 ORC printer, SMX 7000H lamp, using a 21 step Stouffer sensitivity guide as mask (see W. S. DeForest, "Photoresist", McGraw-Hill Book Co., N.Y., pp. 109 ff.). The exposed energy is 80 mJ/cm². After about 5 minutes, the exposed plate is developed for 120 seconds with a 1% aqueous $Na_2CO_3$ solution (30° C., spray pressure 2 bar). After etching with $CuCl_2$/HCl solution at 45° C., a relief image with the final imaged step being No. 4 is obtained. Structures of 50 μm are well resolved.

The resist is subsequently removed by immersion in aqueous 5% NaOH solution at 30° C.

II.2. Positive Etch Resist

A solution of 0.23 g of the photoinitiator Degacure® KI 85 (Degussa) and 0.04 g of 9-methylanthracene in 3 g of methoxypropyl acetate is added to a mixture of 3.5 g of the solution from Example I.2 and 1.5 g of the solution firom Example I.5. The coating, exposure, development and etching are carried out in the same way as in Example II.1. The exposure energy is 80 mJ/cm². The development time is 120 s at 22° C. and a spray pressure of 2 bar. A relief image with the final imaged step being No. 3 is obtained. Structures of 25 μm are well resolved.

II.3. Positive Etch Resist

A solution of 0.23 g of the photoinitiator Degacure® KI 85 (Degussa) and 0.04 g of 9-methylanthracene in 3 g of methoxypropyl acetate is added to a mixture of 2.5 g of the solution from Example I.2 and 2.5 g of the solution from Example I.6. The coating, exposure, development and etching are carried out in the same manner as in Example II.1.

Exposure energy: 80 mJ/cm²; Development time: 120 s (30° C./spray pressure 2 bar); Final imaged step: No. 3; Resolution: 25 μm.

II.4. Positive Etch Resist

A solution of 0.16 g of the photoinitiator Cyracure 6990 (Union Carbide) and 0.04 g of Quantacure ITX (Octel Chemicals) in 1.83 g of methoxypropyl acetate is added to a mixture of 1.5 g of the solution from Example I.2 and 4.67 g of a 30% solution of Scripset 550 in methoxypropyl acetate. The coating, exposure, development and etching are carried out in the same manner as in Example II.1.

Exposure energy: 125 mJ/cm$^2$ Development time: 120 s (35° C./spray pressure 1 bar); Final imaged step: No. 1; Resolution: 25 $\mu$m A comparative test with the solution from Example I.2 after storage for 9 months at room temperature shows no difference.

II.5. Positive Etch Resist

A solution of 0.16 g of the photoinitiator Cyracure 6990 (Union Carbide), 0.04 g of Quantacure ITX (Octel Chemicals) and 0.01 g of Orasolblau GN (Ciba) in 3 g of methoxypropyl acetate is added to a mixture of 3.0 g of the solution from Example I.3 and 2.0 g of the solution from Example I.5. The coating, exposure, development and etching are carried out in the same manner as in Example II.1.

Exposure energy: 150 mJ/cm$^2$ Development time: 100 s (30 ° C./spray pressure 1 bar) Final imaged step: Nr. 2 Resolution: 25 $\mu$m II.6. Positive Etch Resist A solution of 0.16 g of the photoinitiator Cyracure 6990 (Union Carbide) and 0.04 g of Quantacure ITX (Octel Chemicals) in 2.17 g of methoxypropyl acetate is added to a mixture of 2.5 g of the solution from Example I.4 and 3.33 g of a 30% solution of Scripset 550 in methoxypropyl acetate. The coating, exposure, development and etching are carried out in the same manner as in Example II.1.

Exposure energy: 30 mJ/cm$^2$ Development time: 63 s (30° C./spray pressure 1 bar) Final imaged step: No. 3 Resolution: 25 $\mu$m II.7. Positive Etch Resist A solution of 0.32 g of the photoinitiator Cyracure 6974 (Union Carbide), 0.08 g of Quantacure ITX (Octel Chemicals), 0.04 g of Pergascriptblau S-RB (Ciba), 0.02 g of triazine A ((PCAS) and 0.01 g of Orasolblau GN (Ciba) in 6 g of methoxypropyl acetate is added to a mixture of 7.0 g of the solution from Example I.3 and 3.0 g of the solution from Example I.8. The coating, exposure, development and etching are carried out in the same manner as in Example II.1, but a Staub LB 65-1/5000 W lamp is used for the exposure.

Exposure energy: 114 mJ/cm$^2$ Development time: 70 s (30° C./spray pressure 1 bar) Final imaged step: No. 2 Resolution: 25 $\mu$m II.8. Positive Etch Resist A solution of 3.2 g of the photoinitiator Cyracure 6974 (Union Carbide), 0.8 g of Quantacure ITX (Octel Chemicals), 0.4 g of Pergascriptblau S-RB (Ciba), 0.2 g of triazine A ((PCAS) and 0.1 g of Orasolblau GN (Ciba) in 22.7 g of methoxypropyl acetate is added to a mixture of 50 g of the solution from Example I.3 and 50 g of the solution from Example I.9. The coating, exposure, development and etching are carried out in the same manner as in Example II.1, but a 64 g roller coater is used for the coating and a Staub LB 65-1/5000 W lamp is used for the exposure.

Exposure energy: 114 mJ/cm$^2$ Development time: 80 s (30° C./spray pressure 1 bar) Final imaged step: No. 3 Resolution: 25 $\mu$m II.9. Positive Etch Resist A solution of 0.32 g of the photoinitiator Cyracure 6974 (Union Carbide), 0.08 g of Quantacure ITX (Octel Chemicals), 0.04 g of Pergascriptblau S-RB (Ciba), 0.02 g of triazine A ((PCAS) and 0.01 g of Orasolblau GN (Ciba) in 6 g of methoxypropyl acetate is added to a mixture of 3.0 g of the solution from Example I.3 and 7.0 g of the solution from Example I.10. The coating, exposure, development and etching are carried out in the same manner as in Example II.1, but a Staub LB 65-1/5000 W lamp is used for the exposure.

Exposure energy: 114 mJ/cm$^2$ Development time: 70 s (30° C./spray pressure 1 bar) Final imaged step: No. 1 Resolution: 25 $\mu$m II.10. Positive Etch Resist A solution of 0.32 g of the photoinitiator Cyracure 6974 (Union Carbide), 0.08 g of Quantacure ITX (Octel Chemicals), 0.04 g of Pergascriptblau S-RB (Ciba), 0.02 g of triazine A ((PCAS) and 0.01 g of Orasolblau GN (Ciba) in 6 g of methoxypropyl acetate is added to a mixture of 5.0 g of the solution from Example I.7 and 5.0 g of the solution from Example I.10. The coating, exposure, development and etching are carried out in the same manner as in Example II.1, but a Staub LB 65-1/5000 W lamp is used for the exposure.

Exposure energy: 130 mJ/cm$^2$ Development time: 70 s (30° C./spray pressure 1 bar) Final imaged step: No. 4 Resolution: 25 $\mu$m II.11. Positive Etch Resist A solution of 0.32 g of the photoinitiator Cyracure 6974 (Union Carbide), 0.08 g of Quantacure ITX (Octel Chemicals), 0.09 g of Multiflow (Monsanto) and 0.01 g Orasolblau GN (Ciba) in 5.7 g of methoxypropyl acetate is added to a mixture of 5.0 g of the solution from Example I.4 and 5.0 g of the solution from Example I.11. The coating, exposure, development and etching are carried out in the same manner as in Example II.1, but a Staub LB 65-1/5000 W lamp is used for the exposure.

Exposure energy: 130 mJ/cm$^2$ Development time: 100 s (25° C./spray pressure 1 bar) Final imaged step: No. 4 Resolution: 25 $\mu$m II.12. Positive Etch Resist A solution of 0.32 g of the photoinitiator Cyracure 6974 (Union Carbide), 0.08 g of Quantacure ITX (Octel Chemicals), 0.09 g of Multiflow (Monsanto), 0.63 mg of N-methylimidazole and 0.01 g Orasolblau GN (Ciba) in 5.7 g of methoxypropyl acetate is added to a mixture of 5.0 g of the solution from Example I.4 and 5.0 g of the solution from Example I.11. The coating, exposure, development and etching are carried out in the same manner as in Example II.1, but a Staub LB 65-1/5000 W lamp is used for the exposure.

Exposure energy: 200 mJ/cm$^2$ Development time: 40 s (30° C./spray pressure 1 bar) Final imaged step: No. 3 Resolution: 25 $\mu$m II.13. Positive Etch Resist A solution of 0.32 g of the photoinitiator Cyracure 6974 (Union Carbide), 0.08 g of Quantacure ITX (Octel Chemicals), 0.09 g of Multiflow (Monsanto), 6.3 mg of N-methylimidazole and 0.01 g Orasolblau GN (Ciba) in 5.7 g of methoxypropyl acetate is added to a mixture of 5.0 g of the solution from Example I.4 and 5.0 g of the solution from Example I.11. The coating, exposure, development and etching are carried out in the same manner as in Example II.1, but a Staub LB 65-1/5000 W lamp is used for the exposure.

Exposure energy: 200 mJ/cm$^2$ Development time: 70 s (30° C./spray pressure 1 bar) Final imaged step: No. 3 Resolution: 25 $\mu$m II.14. Positive Etch Resist A solution of 0.32 g of the photoinitiator Cyracure 6974 (Union Carbide), 0.08 g of Quantacure ITX (Octel Chemicals), 0.04 g of Pergascriptblau S-RB (Ciba), 0.2 g of triazine A ((PCAS) and 0.01 g of Orasolblau GN (Ciba) in 6 g of methoxypropyl acetate is added to a mixture of 4.0 g of the solution from Example I.7 and 6.0 g of the solution from Example I.11. The coating, exposure, development and etching are carried out in the same manner as in Example II.1, but a Staub LB 65-1/5000 W lamp is used for the exposure.

Exposure energy: 130 mJ/cm² Development time: 60 s (30° C./spray pressure 1 bar) Final imaged step: No. 5 Resolution: 25 µm II.15. Positive Etch Resist A solution of 0.16 g of the photoinitiator (4-nitrophenyl)methyl 9,10dihydroxy-2-anthracenesulfonate, 0.4 g of Pergascriptblau S-RB (Ciba), 0.2 g of triazine A ((PCAS) and 0.01 g of Orasolblau GN (Ciba) in 5.7 g of methoxypropyl acetate is added to a mixture of 4.0 g of the solution from Example I.7 and 6.0 g of the solution from Example I.11. The coating, exposure, development and etching are carried out in the same manner as in Example I.1, but a Staub LB 65-1/5000 W lamp is used for the exposure.

Exposure energy: 130 mJ/cm² Development time: 70 s (30° C./spray pressure 1 bar) Final imaged step: No. 2 Resolution: 25 µm II.16. Positive Etch Resist A solution of 0.32 g of the photoinitiators Cyracure 6974 (Union Carbide), 0.08 g of Quantacure ITX (Octel Chemicals), 0.09 g of Multiflow (Monsanto) and 0.01 g of Orasolblau GN (Ciba) in 5.7 g of methoxypropyl acetate is added to a mixture of 5.0 g of the solution from Example I.11 and 5.0 g of the solution from Example I.12. The coating, exposure, development and etching are carried out in the same manner as in Example II.1, but a Staub LB 65-1/5000 W lamp is used for the exposure.

Exposure energy: 200 mJ/cm² Development time: 135 s (30° C./spray pressure 1 bar) Final imaged step: No. 2; Resolution: 25 µm II.17. Positive Etch Resist A solution of 0.16 g of the photoinitiator diphenyliodonium hexafluoroarsenate, 0.08 g of Quantacure ITX (Octel Chemicals), 0.09 g of Multiflow (Monsanto) and 0.01 g Orasolblau GN (Ciba) in 5.7 g of methoxcypropyl acetate is added to a mixture of 5.0 g of the solution from Example I.11 and 5.0 g of the solution from Example I.12. The coating, exposure, development and etching are carried out in the same manner as in Example II.1, but a Staub LB 65-1/5000 W lamp is used for the exposure.

Exposure energy: 130 mJ/cm² Development time: 70 s (30° C./spray pressure 1 bar) Final imaged step: No. 5 Resolution: 25 µm

What is claimed is:

1. A positive photoresist composition which can be developed in aqueous-alkaline media, consisting essentially of (a) at least one a homopolymer or copolymer comprising 8–100% by weight of recurring structural units of the formula Ia and 92–0% by weight of recurring structural units of the formula Ib

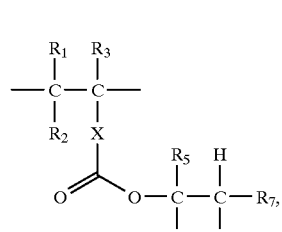

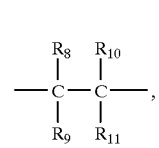

in which

X is a direct bond or a divalent aliphatic, cycloaliphatic or heterocyclic radical having 1–18 carbon atoms, in which one or more carbon atoms may be replaced by oxygen, sulfur or non-basic nitrogen atoms, $R_1$, $R_2$ and $R_3$, independently of one another are hydrogen, $C_1$–$C_6$alkyl, $C_5$–$C_{14}$aryl, $C_6$–$C_{20}$aralkyl, halogen, —COOH, —COOR$_{12}$ or —CONR_R$_{14}$, where $R_{12}$ is an unsubstituted or $C_1$–$C_6$alkoxy-, hydroxyl- or halogen-substituted $C_1$–$C_{18}$alkyl group or the radical of a hydroxyl-terminated polyether or polyester, and $R_{13}$ and $R_{14}$, independently of one another, are hydrogen, $C_1$–$C_{18}$alkyl, $C_5$–$C_{14}$aryl or $C_6$–$C_{20}$aralkyl, $R_4$ is $C_1$–$C_6$alkyl or phenyl, $R_5$ is hydrogen or $C_1$–$C_6$alkyl, and $R_6$ and $R_7$, independently of one another, are hydrogen, $C_1$–$C_6$alkyl or $C_1$–$C_6$alkoxy, or two of the radicals $R_4$, $R_5$, $R_6$ or $R_7$, together with the carbon or oxygen atoms to which they are bonded, form a 5- to 8-membered ring, $R_8$, $R_9$, $R_{10}$ and $R_{11}$, independently of one another, are hydrogen, $C_1$–$C_{18}$alkyl, unsubstituted or $C_1$–$C_6$-alkyl-, $C_1$–$C_6$alkoxy- or halogen-substituted phenyl, halogen, $C_1$–$C_{18}$alkoxy, —COOR$_{12}$, —OCOR$_{12}$ or —COOH, in which $R_{12}$ is as defined above, or $R_9$ and $R_{11}$ together with the carbon atoms to which they are bonded, form a five-membered ring having the structure

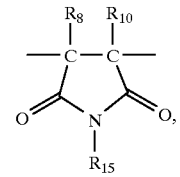

in which $R_{15}$ is hydrogen, $C_1$–$C_{18}$alkyl, $C_5$–$C_{14}$aryl, $C_6$–$C_{20}$aralkyl or hydroxyl-, alkoxy- or halogen-substituted phenyl, with the proviso that the mean molecular weight (weight average) of the homopolymer or copolymer is 1000–500,000 and the amount of COOH groups is at most 0.4 mol/kg, (b) at least one copolymer comprising 5–40% by weight of recurring structural units of the formula IIa and 95–60% by weight of recurring structural units of the formula IIb

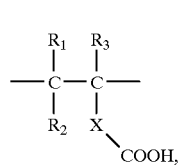

(IIa)

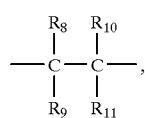

(IIb)

in which $R_1$, $R_2$, $R_3$ and X are as defined in formulas Ia and Ib, in which $R_8$ and $R_9$ are hydroaen, $R_{10}$ is hydrogen or methyl and $R_{11}$ is phenyl or —$COOR_{12}$, in which $R_{12}$ is $C_1$–$C_{18}$alkyl, or at least one copolymer comprising recurring structural units of the formula

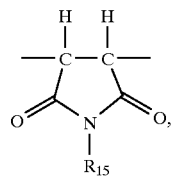

in which $R_{15}$ is phenyl
with the proviso that the mean molecular weight (weight average) of the copolymer is 1000–500,000 daltons and the content of carboxyl groups is from 0.40 to 4.00 mol carboxyl groups per kg copolymer, (c) at least one compound which forms an acid on exposure to actinic radiation, and (d) an organic solvent.

2. A composition according to claim 1, wherein component (a) is at least one homopolymer or copolymer comprising recurring structural units of the formula Ia in which $R_1$ and $R_2$ are hydrogen and $R_3$ is hydrogen or methyl.

3. A composition according to claim 1, wherein component (a) is at least one homopolymer or copolymer comprising recurring structural units of the formula III

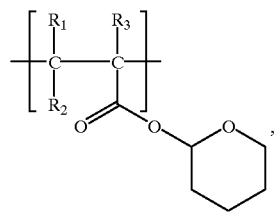

(III)

in which
$R_1$, $R_2$ and $R_3$, are as defined in claim 1.

4. A composition according to claim 3, wherein component (a) is at least one homopolymer or copolymer comprising recurring structural units of the formula III in which $R_1$ and $R_2$ are hydrogen and $R_3$ is hydrogen or methyl.

5. A composition according to claim 1, wherein component (b) is at least one copolymer comprising 5–40% by weight of recurring structural units of the formula IIa and 95–60% by weight of recurring structural units of the formula IIb

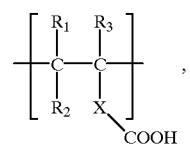

(IIa)

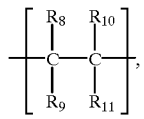

(IIb)

in which $R_1$, $R_2$, $R_3$, $R_8$, $R_9$, $R_{10}$, $R_{11}$ and X are as defined in claim 1, with the proviso that the mean molecular weight (weight average) of the copolymer is 1000–500,000 daltons and the content of carboxyl groups is from 0.40 to 4.00 mol/kg.

6. A composition according to claim 5, wherein component (b) is at least one copolymer comprising recurring structural units of the formula (IIa), in which $R_1$ and $R_2$ are hydrogen, $R_3$ is hydrogen or methyl and X is a direct bond.

7. A composition according to claim 5, wherein component (b) is at least one copolymer comprising 5–35% by weight of recurring structural units of the formula IIa and 95–65% by weight of recurring structural units of the formula IIb.

8. A composition according to claim 1, wherein component (a) is at least one homopolymer or copolymer comprising 20–100% by weight of recurring structural units of the formula Ia and 80–0% by weight of recurring structural units of the formula Ib.

9. A composition according to claim 1, comprising 10–95% by weight of component (a) and 90–5% by weight of component (b), based on the sum of components (a)+(b).

10. A composition according to claim 1, wherein component (c) is a photosensitive diazonium, sulfonium, sulfoxonium or iodonium salt or a photosensitive sulfonic acid ester.

11. A composition according to claim 1, wherein component (c) is triphenylsulfonium tifluoromethanesulfonate, triphenylsulfonium hexafluoroantimonate, triphenylsulfonium hexafluorophosphate, triphenylsulfonium hexafluoroarsenate or a hexafluorophosphate or hexafluoroantimonate of the following sulfonium ions:

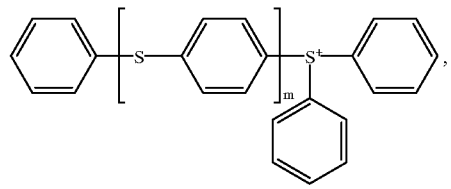

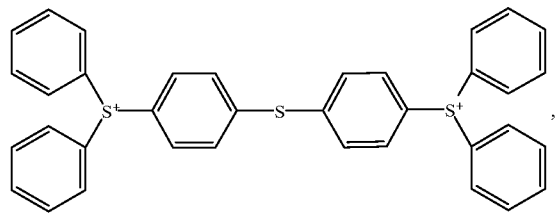

in which m is an integer from 1 to 10.

12. A composition according to claim 1, wherein component (d) is methoxypropyl acetate.

13. A process for the production of relief structures on a circuit board, which comprises coating a substrate with a composition according to claim 1, and exposing the film obtained after removal of the solvent imragewise and subsequently developing the exposed film in an aqueous-alkaline medium.

14. A process according to claim 13, which comprises the following steps:
   (A) coating a copper-laminated substrate with a composition according to claim 1 by application of liquid resists by known methods;
   (B) removal of the solvent by drying at temperatures of from 30° C. to 130° C.;
   (C) exposure to actinic radiation through a mask or by means of direct laser irradiation;
   (D) development using aqueous-alkaline or semiaqueous-alkaline developer solutions;
   (E) etching and;
   (F) removal of the photoresist coating which remains by stripping.

* * * * *

UNITED STATES PATENT AND TRADEMARK OFFICE
CERTIFICATE OF CORRECTION

PATENT NO. : 5,939,242

DATED : AUGUST 17, 1999

INVENTOR(S) : QIAN TANG ET AL.

It is certified that error appears in the above-identified patent and that said Letters Patent is hereby corrected as shown below:

On the title page, item [30] should read:

-- [30] Foreign Application Priority Data

June 22, 1994    Switzerland    01 992/94-8

January 18, 1995    Switzerland    00 138/95-5 --

Signed and Sealed this

First Day of February, 2000

Attest:

Q. TODD DICKINSON

Attesting Officer

Acting Commissioner of Patents and Trademarks